(12) United States Patent
Lee

(10) Patent No.: US 7,030,005 B2
(45) Date of Patent: Apr. 18, 2006

(54) METHOD OF MANUFACTURING SEMICONDUCTOR DEVICE

(75) Inventor: Jae Suk Lee, Icheon-si (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/024,731

(22) Filed: Dec. 30, 2004

(65) Prior Publication Data

US 2005/0239280 A1    Oct. 27, 2005

(30) Foreign Application Priority Data

Apr. 23, 2004    (KR) .................. 10-2004-0028156

(51) Int. Cl.
*H01L 21/4763*    (2006.01)

(52) U.S. Cl. .............. 438/618; 438/619; 438/624

(58) Field of Classification Search ......... 438/618–681
See application file for complete search history.

(56) References Cited

U.S. PATENT DOCUMENTS 6,268,277 B1 *   7/2001   Bang .......................... 438/619

* cited by examiner

*Primary Examiner*—H. Jey Tsai
(74) *Attorney, Agent, or Firm*—Oblon, Spivak, McClelland, Maier & Neustadt, P.C.

(57) ABSTRACT

Method for forming intermetal dielectric layer is disclosed including steps of: preparing a substrate with wiring on a lower insulating layer, the wiring having a plurality of separating portions; forming first and second water marks on the lower insulating layer located in the separating portions and on upper surfaces of the wiring; transforming the first and second water marks into first and second air bubbles, respectively; depositing a first insulating layer of lower dielectric constant on the whole surface of the substrate, and at the same time, forming first and second air gaps by growing said first and second air bubbles on and between the wirings, respectively; removing the upper portion of the first insulating layer to make open the second air gap; and depositing a second insulating layer of lower dielectric constant on the first insulating layer to fill the opened second air gap.

12 Claims, 4 Drawing Sheets

METHOD OF MANUFACTURING SEMICONDUCTOR DEVICE

BACKGROUND OF THE INVENTION

1. Field of the Invention

The present invention relates to a method for manufacturing semiconductor devices. More specifically, the present invention relates to a method for forming interlayer dielectric layers for interconnecting metal wiring layers.

2. Description of the Related Art

Generally, metallization wiring technology is crucial in IC (Integrated Circuit) devices for providing interconnections among transistors, paths for power supply and signal transmission.

Recently, the increase in integration demands of semiconductor devices has caused the decrease of wiring width, which in turn has led to narrower distances between the metal lines and increase in metal line height. Therefore, a gap filling process of the metal lines becomes important.

Conventionally, BPSG (BoroPhospho-Silicate Glass) film has been used because of its desirable gap filling properties. However, the BPSG film creates a high temperature process problem, and thus silicon dioxide (SiO2) films by CVD (Chemical Vapor Deposition) using HDP (High Density Plasma) are widely used.

FIG. 1 is a cross sectional view of a conventional semiconductor device.

Referring to FIG. 1, a lower insulating layer 11 is formed on a semiconductor substrate 10 and wiring layer 100 is formed on the lower insulating layer 11. The wiring layer 100 is comprised of a first Ti/TiN layer 12, metal layer of aluminum 13 and a second Ti/TiN layer 14 acting as ARC (Anti-Reflective Coating) film, all of them being sequentially stacked.

An inter-metal dielectric layer 15 made of $SiO_2$ is formed by HDP-CVD to fill the gaps between the wiring layer 100.

A signal propagation speed is determined by parasitic capacitance (C) and resistance (R) between the wirings 100. Signal delay (T) can be represented by the following Equation 1:

$$T \propto RC \qquad \text{[Equation 1]}$$

When the distance (d) between the wirings 100 decreases to less than 0.2 um as a result of higher integration demands, the parasitic capacitance between the wirings 100 tends to increase as seen from Equation 2:

$$C = \epsilon(S/d) \text{ (where, } \epsilon \text{ is dielectric constant, } S \text{ is area of the wiring, and } d \text{ is distance between wirings)} \qquad \text{[Equation 2]}$$

Therefore, in order to decrease the parasitic capacitance (C), the area (S) and dielectric constant ($\epsilon$) should be lowered.

However, the inter-metal dielectric 15 is made of $SiO_2$ having relatively high dielectric constant ($\epsilon$) of 3.7~4 and it is difficult to increase the area (S) because of the resistance (R) of the wiring 100. Therefore, the signal delay (T) according the higher integration is inevitable and thus it is difficult to realize modem semiconductor devices with small wiring sizing that can also achieve high speed signal transfer.

SUMMARY OF THE INVENTION

One object of the present invention is to resolve the above-identified and other limitations of conventional semiconductor devices. Accordingly, one object of the present invention is to minimize signal delay and prevent the increase of parasitic capacitance between wirings.

Another object of the present invention is to realize IC devices having higher operational speeds than conventional devices.

A method according to the present invention includes steps of: preparing a substrate with wiring on a lower insulating layer, the wiring having a plurality of separating portions; forming first and second water marks on the lower insulating layer located in the separating portions and on upper surfaces of the wiring; transforming the first and second water marks into first and second air bubbles, respectively; depositing a first insulating layer of lower dielectric constant on the whole surface of the substrate, and at the same time, forming first and second air gaps by growing the first and second air bubbles on and between the wirings, respectively; removing the upper portion of the first insulating layer to open the second air gap; and depositing a second insulating layer of lower dielectric constant on the first insulating layer to fill the opened second air gap.

These and other aspects will become evident by reference to the description of the invention.

DETAILED DESCRIPTION OF THE INVENTION

Figure 1:
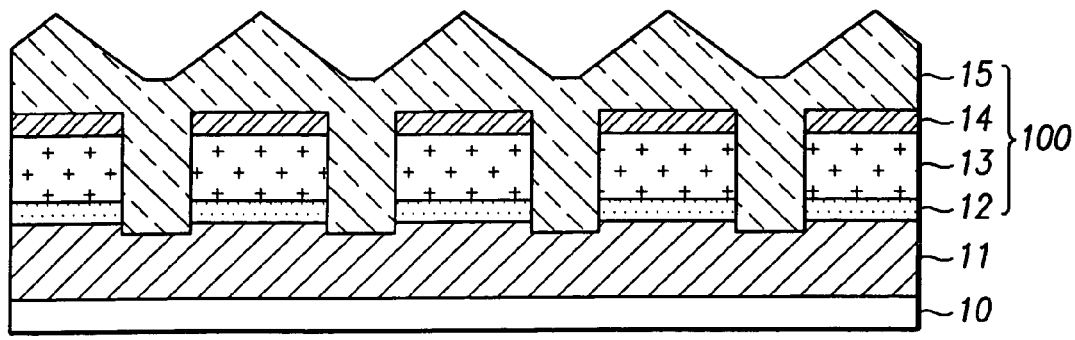
FIG. 1 is a cross sectional view of a conventional semiconductor device.
Figure 2A:
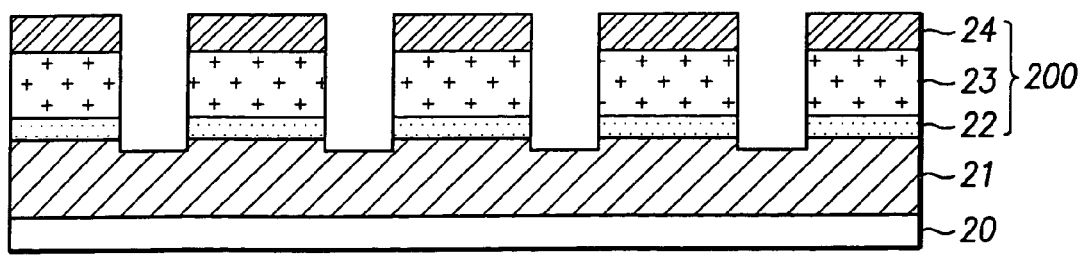
FIGS. 2A to 2F are cross sectional views of a semiconductor device for illustrating the manufacturing process thereof according to the present invention.
Figure 2B:
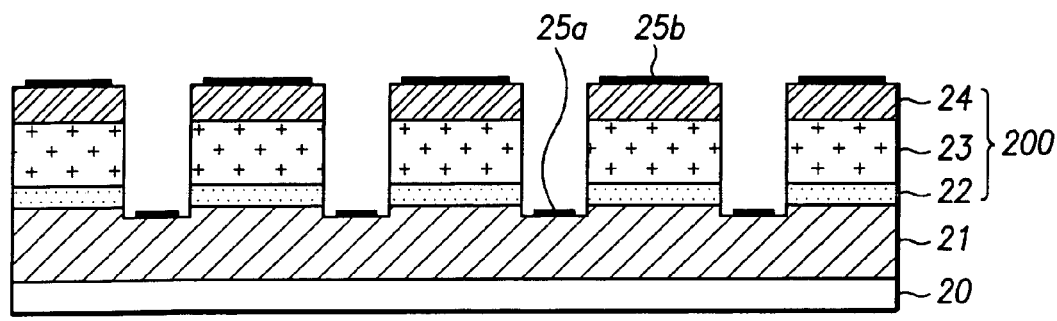
Figure 2C:
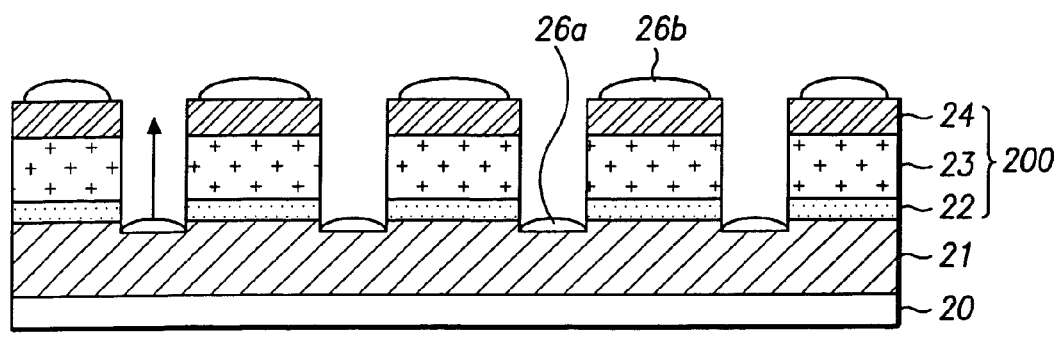
Figure 2D:
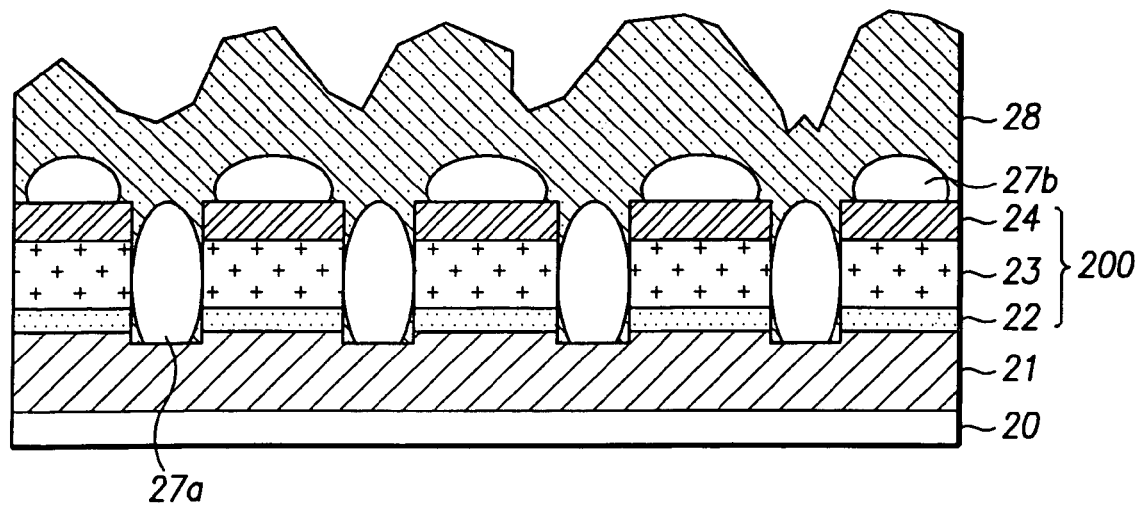
Figure 2E:
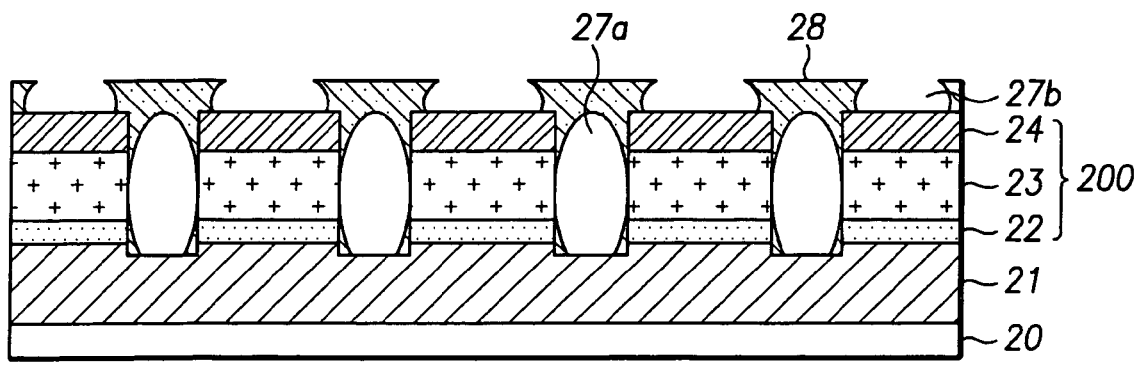
Figure 2F:
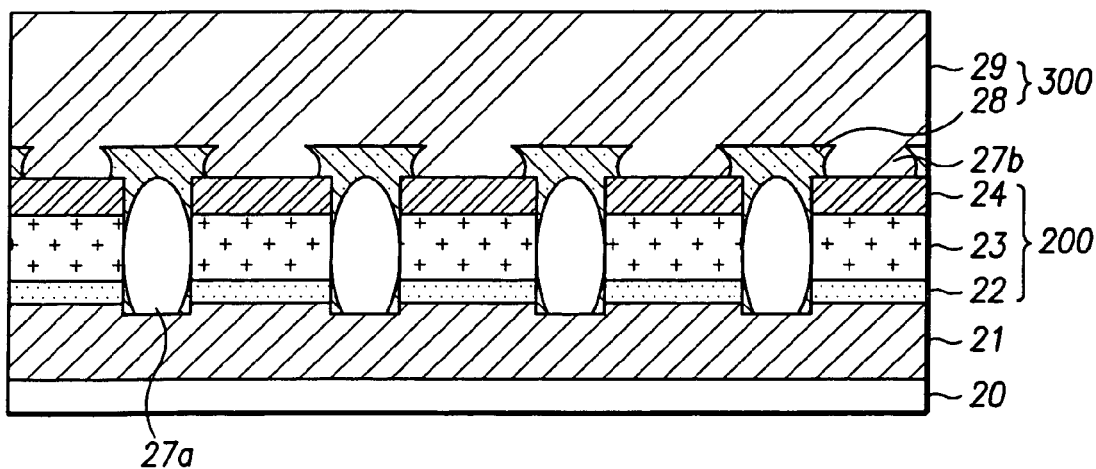

Referring to FIG. 2F, it is explained the structure of semiconductor device manufactured according to the present invention.

As shown in FIG. 2F, a lower insulating layer 21 is formed on a semiconductor substrate 20. The substrate is made of e.g., silicon. On the lower insulating layer 21 is formed a wiring layer 200 having separating portions shaped as rectangular trenches.

The wiring layer 200 includes sequentially stacked layers of a first Ti/TiN layer 22, a metal layer 23 and a second Ti/TiN layer 24. The first Ti/TiN layer 22 is a sort of adhesive layer, while the second Ti/TiN layer 24 is an ARC film. The metal layer 23 is a wiring metal line made of e.g., aluminum.

The gap between wirings 200 is filled with a first air gap 27a having dielectric constant of '1'. On the first air gap 27a and the wiring 200, is formed an intermetal dielectric layer 300 that has a dielectric constant of about 2 to 3 lower than the conventional SiO2.

The intermetal dielectric layer 300 includes a first insulating layer 28 and a second insulating layer 29. The first insulating layer 28 includes a second air gap 27b that exposes the top surface of wiring 200, preserves the first air gap 27a, and is formed on the first air gap 27a and the wiring 200. The second insulating layer 29 fills the second air gap 27b and is formed on the first insulating layer 28.

The first insulating layer 28 is formed by PECVD (Plasma Enhanced Chemical Vapor Deposition) for the preservation of the first air gap 27a and made of e.g., FSG (Fluorinated Silica Glass) film or SiOC film.

The second insulating layer 29 is deposited by SOG (Spin On Glass) method and annealed for the filling of the second air gap 27b. Fluorine-doped polyimide film, nano-porous Si film or aromatic hydrocarbon poly ether film may be used for the second insulating layer 29.

Now is explained the method of manufacturing semiconductor devices according to the present invention with reference to FIGS. 2A to 2F.

Referring to FIG. 2A, a lower insulating layer 21 is formed on a semiconductor substrate 20 on which circuit elements such as transistors are formed (not shown for the simplicity of the drawings).

On the lower insulating layer 21 is deposited a Ti/TiN film 22 that functions as an adhesive layer, and aluminum layer 23 is deposited on the Ti/TiN layer 22. As an ARC layer, a second Ti/TiN film 24 is deposited on the aluminum layer 23.

Then, the first Ti/TiN layer 22, aluminum layer 23 and second Ti/TiN layer 24 are patterned to be separated with portions of the stacked three layers by photolithography and etching processes to form the wiring 200.

Referring to FIG. 2B, the substrate 20 with the wiring patterns is cleaned by HCl solution, dried by a spin dry method, and exposed to atmospheric air so that first and second water marks 25a and 25b are formed on the bottom surfaces of the lower layer 21 between the separated portions of the wiring 200 and top surfaces of the wiring 200, respectively. It is preferable that the spin drying is performed at a gradually decreasing speed of equal to or less than 1,000 rpm and the exposure time to the atmospheric air are maintained more than about 4 hours.

Referring to FIG. 2C, the substrate 20 with the first and second water marks 25a and 25b are annealed in-situ under inert gas environment of Ar, He, Xe, Kr or Ne and at a temperature ranging from 300 to 500° C., more preferably at about 400° C., to transform the water marks 25a and 25b to be first and second air bubbles 26a and 26b.

Referring to FIG. 2D, the first insulating layer 28 is formed on the whole surface of the substrate and at the same time the first and second air bubbles 26a and 26b are grown to be first and second air gaps 27a and 27b. The first insulating layer 28 has a dielectric constant of about 2 to 3, which is less than the dielectric constant of the conventional insulating layer of SiO2.

At this time, the first air bubble 26a between the separated portions of the wiring 200 grows faster by the capillary phenomenon and, therefore, most part of the gap between the wirings 200 are filled with the first air gap 27a.

The first insulating layer 28 is formed by the PECVD and is made of e.g., FSG (Fluorinated Silicate Glass) film or SiOC film.

Referring to FIG. 2E, the upper portion of the first insulating layer 28 is removed by e.g., CMP (Chemical Mechanical Polishing) so that the top surface of the second air gap 27b is made open.

Referring to FIG. 2F, a second insulating layer 29 that has a dielectric constant of about 2 to 3 is deposited on the first insulating layer 28 and completely fills up the opened second air gap 27b.

The second insulating layer 29 is deposited by SOG and annealed. Fluorine doped polyimide film, nano-porous Si film or aromatic hydrocarbon poly ether film may be used for the second insulating layer 29.

The present application contains subject matter related to that disclosed in Korean patent application No. 2004-28156, filed on Apr. 23, 2004, the entire contents of which is incorporated herein by reference.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for manufacturing a semiconductor device comprising the steps of:
   preparing a substrate with wiring on a lower insulating layer, said wiring having a plurality of separating portions;
   forming first and second water marks on the lower insulating layer respectively located in the separating portions and on upper surfaces of the wiring;
   transforming the first and second water marks into first and second air bubbles, respectively;
   depositing a first insulating layer of dielectric constant lower than about 3.5 on a whole surface of the substrate, and also, forming first and second air gaps by growing said first and second air bubbles between and on the wirings, respectively;
   removing the upper portion of the first insulating layer to open the second air gap; and
   depositing a second insulating layer of dielectric constant lower than about 3.5 on the first insulating layer to fill the opened second air gap.

2. The method of claim 1, wherein the step for forming the water marks includes the steps of:
   cleaning the substrate with the wiring with HCl solution;
   drying the cleaned substrate by a spin dry method; and
   exposing the dried substrate to atmospheric air.

3. The method of claim 2, wherein the spin dry is performed at a gradually decreasing speed of equal to or less than 1,000 rpm.

4. The method of claim 2, wherein the step of exposing the dried substrate to atmospheric air continues more than about 4 hours.

5. The method of claim 3, wherein the step of exposing the dried substrate to atmospheric air continues more than about 4 hours.

6. The method of claim 1, wherein the air bubbles are formed by annealing the substrate under inert gas environment and at a temperature ranging from 300 to 500 ° C.

7. The method of claim 6, the inert gas is one selected from a group consisting of Ar, He, Xe, Kr and Ne.

8. The method of claim 1, wherein the first insulating layer is formed by PECVD (Plasma Enhanced Chemical Vapor Deposition) of FSG (Fluorinated Silica Glass) film or SiOC film.

9. The method of claim 1, wherein the step of forming the first insulating layer includes depositing a material having a dielectric constant in an inclusive range of 2 through 3.

10. The method of claim 1, wherein the second insulating layer is formed by SOG (Spin On Glass) deposition of a fluorine-doped polyimide film, a nano-porous Si film or an aromatic hydrocarbon poly ether film and annealing.

11. The method of claim 1, wherein in the step of depositing the second insulating layer includes depositing a material having a dielectric constant in an inclusive range of 2 through 3.

12. A method for manufacturing a semiconductor device comprising the steps for:
   preparing a substrate with wiring on a lower insulating layer, said wiring having a plurality of separating portions;
   forming first and second water marks on the lower insulating layer respectively located in the separating portions and on upper surfaces of the wiring;

transforming the first and second water marks into first and second air bubbles, respectively;

depositing a first insulating layer of dielectric constant lower than about 3.5 on a whole surface of the substrate, and also, forming first and second air gaps by growing said first and second air bubbles between and on the wirings, respectively;

removing the upper portion of the first insulating layer to open the second air gap; and depositing a second insulating layer of dielectric constant lower than about 3.5 on the first insulating layer to fill the opened second air gap.

* * * * *